(12) United States Patent
Hoshi et al.

(10) Patent No.: US 9,853,700 B2
(45) Date of Patent: Dec. 26, 2017

(54) WIRELESS TRANSMISSION SYSTEM AND RECEPTION DEVICE

(71) Applicant: Hitachi Kokusai Electric Inc., Tokyo (JP)

(72) Inventors: Daiki Hoshi, Tokyo (JP); Tatsuhiro Nakada, Tokyo (JP); Kei Ito, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/459,508

(22) Filed: Mar. 15, 2017

(65) Prior Publication Data

US 2017/0187434 A1    Jun. 29, 2017

Related U.S. Application Data

(63) Continuation-in-part of application No. PCT/JP2015/075737, filed on Sep. 10, 2015.

(30) Foreign Application Priority Data

Sep. 24, 2014 (JP) ................................. 2014-193741

(51) Int. Cl.
*H04L 7/04* (2006.01)
*H04B 7/0413* (2017.01)
*H04L 1/00* (2006.01)

(52) U.S. Cl.
CPC ......... *H04B 7/0413* (2013.01); *H04L 1/0071* (2013.01)

(58) Field of Classification Search
CPC ........................... H04B 7/0413; H04L 1/0071
See application file for complete search history.

(56) References Cited

U.S. PATENT DOCUMENTS

| 6,343,368 | B1 | 1/2002 | Lerzer |
| 6,856,657 | B1 | 2/2005 | Classon et al. |

(Continued)

FOREIGN PATENT DOCUMENTS

| JP | 2002-533991 | 10/2002 |
| JP | 2009-033231 A | 2/2009 |

(Continued)

OTHER PUBLICATIONS

Association of Radio Industries and Businesses (ARIB), "1.2 GHz/2.3 GHz-Band portable OFDM digital transmission system for television program contribution", ARIB STD-B57 Ver. 1.0, Dec. 10, 2013, pp. 16-27, Japan.

(Continued)

*Primary Examiner* — Dac Ha
(74) *Attorney, Agent, or Firm* — Brundidge & Stanger, P.C.

(57) ABSTRACT

An object of the present invention is to generate a soft estimation value where missing of bit information is avoided and to implement turbo equalization processing in a wireless transmission apparatus and a wireless transmission system where termination processing is not performed in an error correction coding part and interleave processing over frames is performed. A wireless transmission system of the present invention includes a transmission apparatus and a reception apparatus. The transmission apparatus includes an error correction coding unit, a first interleave unit, a second interleave unit, and a digital modulation unit. The reception apparatus includes a unit that detects a reception signal, a demapper, a second deinterleave unit, a unit to store a received bit logarithm of likelihood ratio in a frame buffer, a frequency interleaver data extraction part that extracts data of a predetermined period, a decoding part, and a hard decision part.

5 Claims, 8 Drawing Sheets

(56) References Cited

U.S. PATENT DOCUMENTS

| | | | |
|---|---|---|---|
| 6,868,132 B1 | 3/2005 | Classon et al. | |
| 2003/0093753 A1 | 5/2003 | Okamura et al. | |
| 2009/0103666 A1* | 4/2009 | Zhao ................... | H04L 25/022 375/341 |
| 2009/0285323 A1* | 11/2009 | Sundberg ............. | H04L 1/0631 375/267 |
| 2012/0219079 A1 | 8/2012 | Yoshimoto et al. | |
| 2014/0126507 A1 | 5/2014 | Takahashi et al. | |
| 2014/0321575 A1* | 10/2014 | Asakura ............... | H04L 1/0071 375/296 |

FOREIGN PATENT DOCUMENTS

| | | |
|---|---|---|
| JP | 2013-5139 A | 1/2013 |
| WO | 2011/052429 A1 | 5/2011 |

OTHER PUBLICATIONS

International Search Report from International Application No. PCT/JP2015/075737 dated Oct. 13, 2015.

* cited by examiner

WIRELESS TRANSMISSION SYSTEM AND RECEPTION DEVICE

CROSS-REFERENCE TO RELATED APPLICATION

The present application is a continuation-in-part application under 35 U.S.C. §111(a) of International Application No. PCT/JP2015/075737, filed Sep. 10, 2015, which claims priority to Japanese Patent Application No. 2014-193741, filed Sep. 24, 2014. The contents of these applications are incorporated herein by reference in their entirety.

TECHNICAL FIELD

The present invention relates to a wireless transmission system and a reception apparatus.

BACKGROUND ART

Wireless transmission apparatuses or transmission systems that have conventionally used analog transmission are currently capable of transmitting a larger amount of information as digital transmission systems that are technique to transmit signals digitally modulated become widespread. For example, wireless relay transmission apparatuses that digitally transmit television broadcast program materials are called field pickup units (FPUs), transmission systems thereof are standardized by the Association of Radio Industries and Business (ARIB) standard No. STD-B57 (see Non Patent Literature 2). In a transmission control unit of an FPU, convolutional codes are used for error correction codes. As a decoding method corresponding to the convolutional codes, decoding by the Viterbi algorithm based on a maximum likelihood method is generally used (hereinafter referred to as Viterbi decoding).

In recent years, multi input multi output (MIMO) has been used as signal processing technique to enhance a transmission rate by using a plurality of antennae in a transmission apparatus and a reception apparatus as a required transmission rate increases. In MIMO, transmission data (stream) is divided into a plurality of signals (substreams) and the substreams are transmitted concurrently from the plurality of antennae for reception by the plurality of reception antennae. The signals received by the respective antennae are subjected to interference among the substreams from the transmission antennae; however, separating and detecting the substreams allows for increasing a transmission rate. Also in FPUs the MIMO transmission system is employed. In ARIB STD-B57, single input single output (SISO) configured by one transmission antenna and one reception antenna and 2×2 MIMO configured by two transmission antennae and two reception antennae are standardized. In MIMO transmission systems, separation and detection on the reception apparatus side becomes difficult when spatial correlation between the substreams becomes high and thus transmission characteristics are greatly influenced by spatial correlation. Known as a means to mitigate spatial correlation is to separate antennae on the transmission side; however, FPUs are limited of installment places of antennae in a relay van and thus operation with high spatial correlation is desired.

In recent years, as signal processing technique to enhance decoding performance of MIMO even with high spatial correlation, turbo equalization signal processing has been attracting attention. Turbo equalization signal processing is a method to enhance decoding performance by connecting a demapper to a decoder that function as an equalizer via a deinterleaver and an interleaver and repeating processing to feedback, as prior information to the demapper, external information obtained from a decoding result by the decoder and thereby removing interference components. Specifically, as practical method of implementing turbo equalization signal processing, the soft canceller followed by minimum mean square error filter (SC/MMSE) algorithm is proposed in MIMO. In the SC/MMSE algorithm, an external log-likelihood ratio (LLR), of the decoder obtained by subtracting a received bit LLR input to the decoder from a coded bit LLR having been subjected to error correction decoding processing, is subjected to interleave processing and a soft estimation value is generated from the external LLR having been subjected to interleave processing and then output to the demapper. In the demapper, a replica of an interference component is generated using the input soft estimation value and then is subtracted from a reception signal. Other interference components are removed by an MMSE filter, thereby enhancing decoding performance. In order to implement this algorithm, it is required that the external LLR for generating the soft estimation value is independent and thus a sufficiently long interleave length and a random interleaver are desired.

In turbo equalization signal processing, it is required to use a decoder of soft input and soft output. Examples of a decoding method include maximum a posteriori possibility (MAP) decoding and soft output Viterbi algorithm (SOVA) decoding. Especially, decoding by the BCJR algorithm (hereinafter referred to as BCJR decoding) is known as an algorithm that implements MAP decoding. Simply applying the BCJR algorithm as it is actually results in a huge amount of calculation and is not practical. Generally, Max-Log-MAP decoding is thus used.

Max-Log-MAP decoding based on the BCJR algorithm will be described herein. (See Non Patent Literature 1) In a trellis diagram corresponding to a convolutional encoder where a state transition probability is denoted as $\gamma$, a forward metric is denoted as $\alpha$, a backward metric is denoted as $\beta$, a decoding bit sequence length is denoted as L, a decoding bit sequence number is denoted as 1 (lower case of L), an internal state of a transition source in the trellis diagram is denoted as S', an internal state of a transition destination is denoted as S, and an output from the convolutional encoder of the internal state S is denoted as v, each of the above is represented by the following mathematical formulas.

[Mathematical Formula 1]

$$\gamma(l, S', S) = \frac{1}{2} v(l) \cdot S(l) \quad \text{(Formula 1)}$$

$$\alpha(l+1, S) = \max_{S' \to S} [\gamma(l, S', S) + \alpha(l, S')] \quad \text{(Formula 2)}$$

$$\beta(l, S') = \max_{S' \to S} [\gamma(l, S', S) + \beta(l+1, S)] \quad \text{(Formula 3)}$$

[Mathematical Formula 2]

Next, decoding is performed using Formulas 1 to 3. A received bit LLR is denoted as $L_a^D$. A decoding LLR of information bit $L_u^D$, an encoding bit LLR $L_{v1}^D$, and encoding bit LLR $L_{v2}^D$ are derived from the following calculation.

$$L_u^D(l) = \max_{S', S \in u=+1} [\alpha(l, S') + \gamma(l, S', S) + \beta(l, S)] - \quad \text{(Formula 4)}$$
$$\max_{S', S \in u=-1} [\alpha(l, S') + \gamma(l, S', S) + \beta(l, S)]$$

-continued $$L_{v_1}^D(l) = \max_{S',S \in v_1=+1} [\alpha(l, S') + \gamma(l, S', S) + \beta(l, S)] - \max_{S',S \in v_1=-1} [\alpha(l, S') + \gamma(l, S', S) + \beta(l, S)]$$ (Formula 5)

$$L_{v_2}^D(l) = \max_{S',S \in v_2=+1} [\alpha(l, S') + \gamma(l, S', S) + \beta(l, S)] - \max_{S',S \in v_2=-1} [\alpha(l, S') + \gamma(l, S', S) + \beta(l, S)]$$ (Formula 6)

When BCJR decoding is selected for using turbo equalization signal processing, it is required that framing for decoding processing is performed, that an origin 1=0 and a destination 1=L of the trellis diagram are determined, and that an internal state S0 at the origin 1=0 and an internal state SL at a destination 1=L are known as prior information. Generally, termination processing such as tail-biting processing is performed in order to specify the internal states. However, in an FPU standardized by ARIB STD-B57 no termination processing is performed and thus the internal states of the origin and the destination are not constant. Therefore ambiguity occurs when a survival path is selected at the origin and the destination. Thus an error is likely to occur upon decoding near the origin and the destination, thereby deteriorating bit error rate characteristics. As a decoding method for such a wireless transmission apparatus or a transmission system where no termination processing is performed, sliding window decoding is proposed. (See Patent Literature 1) In sliding window decoding, with a decoding bit sequence where a length of a window of L defined with the origin 1=0 and the destination 1=L, first a trellis learning period K is defined. A forward metric α form 1=−K to 1=0 and a backward metric β from 1=L+K to 1=L are calculated and an internal state S0 at 1=0 and an internal state SL at 1=L are specified. Using the specified internal states, BCJR decoding processing is performed from 1=0 to 1=L. The length of K is thus set to allow for specifying the internal states at 1=0 and 1=L. Using the sliding window decoding allows for mitigating deterioration of decoding performance of BCJR decoding and implementing the BCJR decoding even in a wireless transmission system or apparatus where no termination processing is performed.

Next issues include missing of bit information upon generation of a soft estimation value when turbo equalization signal processing is employed in a transmission system, where no termination processing is performed on a transmitting side, including an interleaver that performs random rearrangement having processing units over frames in order to enhance error correction. For example in an FPU conforming to ARIB STD-B57, a bit interleaver that performs rearrangement in the unit of bits over Orthogonal Frequency Division Multiplexing (OFDM) symbols and a frequency interleaver that performs rearrangement on transmission signals of the respective transmission antennae in the unit of sub carriers in different patterns are combined, thereby implementing random rearrangement. An example of a spatial multiplexing MIMO transmission system of an FPU will be described below for simplicity of description.

A flow of processing in a transmission apparatus of FPU will be described with reference to FIG. 3. In FIG. 3 illustrating a block diagram of processing in the transmission apparatus of FPU, a symbol 301 denotes an error correction coding part, 113 denotes a bit interleaver, 115-1 denotes a first frequency interleaver corresponding to a first transmission signal, 115-2 denotes a second frequency interleaver corresponding to a second transmission signal, 302 denotes a mapper, 303-1 denotes a processing block corresponding to the first transmission signal (304-1 denotes an inverse fast Fourier transform (IFFT) part, 305-1 denotes a digital to analog converter (D/A), and 306-1 denotes a quadrature modulation part), 303-2 denotes a processing block corresponding to the second transmission signal (304-2 denotes an IFFT part, 305-2 denotes a D/A, and 306-2 denotes quadrature modulation part), 307-1 denotes a first transmission antenna, and 307-2 denotes a second transmission antenna.

A transmission bit sequence is input to the error correction coding part 301 whereat error correction encoding processing by convolutional codes is performed. In the FPU, punctured convolutional codes with original codes having a constraint length of 7 and an encoding rate of ½ are used. Along with error correction encoding, the transmission bit sequence is distributed among systems of the first transmission signal transmitted from the first transmission antenna 307-1 and the second transmission signal transmitted from the second transmission antenna 307-2 according to a puncturing pattern and thereby input to the bit interleaver 113.

A bit sequence from input to the bit interleaver 113 to after output from the frequency interleavers 115-1 and 115-2 is illustrated in FIG. 9. The frequency interleavers 115-1 and 115-2 will be described later. In the bit interleaver 113, interleaving in the unit of bits corresponding to a subcarrier modulation system is performed when multi-value modulation is employed. When input signals are defined as b0, b1, b2, b3, b4, b5, . . . , in a subcarrier modulation system of quadrature phase shift keying (QPSK), the input signals are converted into a two-bit form in a first serial to parallel (S/P) conversion part and a 120 bit delay element 402 is inserted for b1, b3, and b5, thereby outputting the bit-interleaved signals as illustrated in FIG. 4.

When a subcarrier modulation system is 8 phase shift keying (PSK), input signals are converted into a three-bit form in a second S/P conversion part 501, a 60 bit delay element 502 is inserted for b1 and b4, and a 120 bit delay element 402 is inserted for b2 and b5, thereby outputting the bit-interleaved signals as illustrated in FIG. 5. When a subcarrier modulation system is 16 quadrature amplitude modulation (QAM), input signals are converted into a four-bit form in a third S/P conversion part 601, a 40 bit delay element 602 is inserted for b1 and b5, an 80 bit delay element 603 is inserted for b2, and a 120 bit delay element 402 is inserted for b3, thereby outputting the bit-interleaved signals as illustrated in FIG. 6. When a subcarrier modulation system is 32QAM, input signals are converted into a five-bit form in a fourth S/P conversion part 701, a 30 bit delay element 702 is inserted for b1, a 60 bit delay element 602 is inserted for b2, a 90 bit delay element 703 is inserted for b3, and a 120 bit delay element 402 is inserted for b4, thereby outputting the bit-interleaved signals as illustrated in FIG. 7.

When a subcarrier modulation system is 64QAM, input signals are converted into a six-bit form in a fifth S/P conversion part, a 24 bit delay element 802 is inserted for b1, a 48 bit delay element 803 is inserted for b2, a 72 bit delay element 804 is inserted for b3, a 96 bit delay element 805 is inserted for b4, and a 120 bit delay element 402 is inserted for b5, thereby outputting the bit-interleaved signals as illustrated in FIG. 8. Regardless of the type of subcarrier modulation system, the 120 bit delay element 402 is inserted upon bit interleaving in multi-value modulation and thus at the maximum 120 carrier symbols are delayed in transmission and reception. A part of a bit sequence of an Nth OFDM symbol includes delayed bits. The maximum delayed length of bits delayed over frames upon interleaving is defined as M'. In the case of FPU, M'=120 holds.

As illustrated in item (i) in FIG. 9, signals before input to an bit interleaver ((i) in FIG. 9) are denoted as b0 to bL−1 (L is derived by L=QL' where Q represents the number of bits allotted to one modulation symbol and L' represents the number of data subcarriers of OFDM symbols.) The example here assumes the bit interleaving when a subcarrier modulation system is 16QAM as illustrated in FIG. 6 with a symbol index of four bits of 0 to 3, that is, Q=4. The input signals are converted into the four-bit form by the third S/P conversion part 601 in FIG. 6 ((ii) in FIG. 9). Then the signal with a symbol index of 1 is delayed by 40 bits by the delay element 602, the signal with a symbol index of 2 is delayed by 80 bits by the delay element 603, and the signal with a symbol index of 3 is delayed by 120 bits by the delay element 402 and thereby output ((iii) in FIG. 9). A hatched area illustrated in (iii) in FIG. 9 represents bits preceding b0 that are mixed due to insertion of delay upon bit interleaving. This example includes 40 bits for the symbol index of 1, 80 bits for 2, and 120 bits for 3.

The signals output from the bit interleaver 113 are then input to the frequency interleavers 115-1 and 115-2. In the frequency interleavers 115-1 and 115-2, subcarriers of OFDM symbols formed by the input bit sequence are rearranged by a predetermined order as illustrated in (iv) in FIG. 9. A unit of processing of frequency interleaving is equivalent to the number of data subcarriers of the OFDM symbols and the length of the unit of this interleave processing is L'. Rearrangement is performed within a range of this length L'.

The series of bit sequences after interleave processing is input to the mapper 302 and is subjected to mapping processing by symbols corresponding to a subcarrier modulation system. The bit sequences after mapping processing are subjected to inverse fast Fourier transform processing in the IFFT parts 304-1 and 304-2 and then converted into time axis signals. These time axis signals are converted from digital signals to analog signals by the D/As 305-1 and 305-2 and then to quadrature modulation by the quadrature modulation parts 306-1 and 306-2. Thereafter the first transmission signal and the second transmission signal are transmitted from the transmission antennas 307-1 and 307-2, respectively. Due to the delay element in the bit interleaver, therefore, a part of the bit sequence of the Nth OFDM symbol includes bits preceding b0 while a part of b0 to bL−1 is included in a bit sequence of the (N+1)th OFDM symbol. Since the FPU is defined by the configuration of the transmission apparatus described above, it is required to wait for the (N+1)th OFDM symbol in order to align b0 to bL−1 in the decoding part. Queuing time for this is defined by the decoding bit sequence length L. Using sliding window decoding in the FPU allows for BCJR decoding while missing of bit information is avoided.

A flow when sliding window decoding with a trellis learning period of K, BCJR decoding, and turbo equalization processing according to the SC/MMSE algorithm are implemented in the reception apparatus of the FPU will be described below as a conventional configuration. In FIG. 2 that is a block diagram explaining processing in a reception control part of a conventional configuration, a symbol 101-1 denotes a first reception antenna, 101-2 denotes a second reception antenna, 102-1 denotes a processing block corresponding to a first reception signal (103-1 denotes a quadrature detection part, 104-1 denotes an analog to digital converter (A/D), and 105-1 denotes a fast Fourier transform part (FFT part)), 102-2 denotes a processing block corresponding to a second reception signal (103-2 denotes a quadrature detection part, 104-2 denotes an A/D, and 105-2 denotes an FFT part), 106 denotes a demapper, 107-1 denotes a first frequency deinterleaver corresponding to the frequency interleaver 115-1, likewise, 107-2 denotes a second frequency deinterleaver corresponding to the frequency interleaver 115-2, 108 denotes a bit deinterleaver, 109 denotes a frame buffer, 111 denotes a BCJR decoding part, 112 denotes a hard decision part, and 201 denotes a second decoding data extraction part.

The reception signals received by the reception antennas 101-1 and 101-2 are converted from analog to digital sample sequences by the A/Ds 104-1 and 104-2 and a FFT time window of an effective symbol length is provided at such a timing that interference among symbols are avoided. The time axis data within the FFT time window are subjected to fast Fourier transform processing in the FFT parts 105-1 and 105-2 and then converted into frequency axis signals. In the demapper 106 a soft estimation value is generated from an external LLR output from the decoder and having been subjected to interleave processing as soft canceller processing. An interference replica corresponding to each of the reception signals from the first reception antenna 101-1 and the second reception antenna 101-2 is generated from the obtained soft estimation value. The interference replica is subtracted from each of the reception signals. Note that this subtraction is not performed before repetition processing since there is no prior information on the interference replica. A signal subtracted of the interference component is input to the MMSE filter and is separated and detected by spatially filtering transmission signals from the respective transmission antennae. A received bit LLR of a symbol is calculated from the separated and detected signal.

As for bit sequences related to the received bit LLR, a received bit LLR corresponding to a signal transmitted from the first transmission antenna is input to the frequency deinterleaver 107-1 and a received bit LLR corresponding to a signal transmitted from the second transmission antenna is input to the frequency deinterleaver 107-2. The frequency deinterleaver 107-1 once again rearranges an order of subcarriers having been rearranged in the frequency interleaver 115-1 into an original order. The frequency deinterleaver 107-2 once again rearranges an order of subcarriers having been rearranged in the frequency interleaver 115-2 into an original order. A unit of deinterleave processing is defined by L' similarly to that of the frequency interleaver. The bit sequence after frequency deinterleaving is output to the bit deinterleaver 108.

The bit sequence input to the bit deinterleaver 108 is removed of delay having been inserted in the bit interleaver 113 according to the type of subcarrier modulation system, then subjected to parallel to serial (P/S) conversion processing, and then output to the frame buffer 109. The frame buffer 109 stores, by a length of L, the bit sequence related to the received bit LLR having been subjected to the series of interleave processing.

Processing of the bit sequence from input to the decoding part to input to the frequency interleaver in a turbo loop in the conventional configuration is illustrated in FIG. 10. When an origin and a destination of the Nth OFDM symbol to be subjected to decoding processing are defined as l=(N−1)L and l=NL, respectively, a decoding bit sequence from l=(N−1)L−K to l=NL+K is extracted from the frame buffer 109 using the second decoding data extraction part and input to the BCJR decoding part 111 ((i) in FIG. 10).

A transition state probability γ and a forward metric α are calculated using Formulas 1 and 2 from a reception bit LLR of the trellis learning period K from l=(N−1)L−K to l=(N−1)L input to the BCJR decoding part 111 and thereby an internal state at l=(N−1)L is specified. In the similar manner, the transition state probability γ and a backward metric β are calculated using Formulas 1 and 3 from a reception bit LLR of the trellis learning period K from l=NL+K to l=NL and thereby an internal state at l=NL is specified. From the internal state at l=(N−1)L and an internal state at l=NL obtained from the above processing, the transition state probability γ, the forward metric α, and the backward metric β for a bit sequence corresponding to l=(N−1)L to l=NL are calculated using Formulas 1 to 3. In the BCJR decoding part 111, l=(N−1)L to l=NL are decoded using Formulas 4 to 6 from the obtained transition state probability γ, the forward metric α, and the backward metric β and a decoded bit LLR and a coded bit LLR are then calculated and output ((ii) in FIG. 10). The obtained coded bit LLR having the length of L from l=(N−1)L to l=NL is subtracted of a prior LLR input to the BCJR decoding part 111 having the length L from l=(N−1)L to l=NL to derive an external LLR output from the BCJR decoding part 111.

The external LLR output from the BCJR decoding part 111 is input to the bit interleaver 113. In the bit interleaver 113, S/P conversion is performed by a unit of bits like on the transmission apparatus side and then convolutional interleave processing is performed by a delay element according to the type of subcarrier modulation system, followed by output therefrom ((iii) in FIG. 10). Since M'=120 carrier symbols are delayed at the maximum by the delay element, (1) and (3) are rearranged as bit sequences related to the external LLR of the Nth OFDM symbol while (2) is rearranged as bit sequences related to the external LLR of the (N−1)th OFDM symbol upon output from the bit interleaver ((iii) in FIG. 10).

The external LLR corresponding to a transmission signal from the first transmission antenna is input to the frequency interleaver 115-1 and the external LLR corresponding to a transmission signal from the second transmission antenna is input to the frequency interleaver 115-2. In the respective frequency interleavers, subcarriers of OFDM symbols formed by the input bit sequences are rearranged by a predetermined order. Here, rearrangement is performed in different patterns between the frequency interleaver 115-1 and the frequency interleaver 115-2 for output. A unit of processing of frequency interleaving is L' and thus rearrangement is performed within the length L'. Therefore (1) and (2) that are bit sequences from l=(N−1)L' to l=NL' are subjected to rearrangement.

A bit sequence of the external LLR having been subjected to the series of interleave processing is input to the demapper 106 and a soft estimation value is calculated from the external LLR and mapping points that may be used in the subcarrier modulation system. From this soft estimation value an interference replica of the first reception signal corresponding to the first reception antenna and an interference replica of the second reception signal corresponding to the second reception antenna are generated. The interference replica is subtracted from each of the reception signals, thereby performing soft cancel (SC). When the soft estimation value is generated from the decoding result of the Nth OFDM symbol, therefore, the bit sequences of (1) and (2) are required upon input to the frequency interleaver ((iv) in FIG. 10). However, (2) is the bit sequence of the (N−1)th OFDM symbol and thus missing of bit information occurs in the conventional configuration. Interference removal due to incomplete soft estimation value is performed due to missing of bit information and this decoding performance is disadvantageously deteriorated.

Other cited literatures include Japanese Translation of PCT International Application Publication No. 2002-533991 (Patent Literature 2).

CITATION LIST

Patent Literature

Patent Literature 1: JP 3741616 A (JP 2001-267936 A)
Patent Literature 2: Japanese Translation of PCT International Application Publication No. 2002-533991

Non Patent Literature

Non Patent Literature 1: Gijyutsu Shiryo Syu (bunrui) 2-4-1, Syu-hen Yohso Gijyutsu, Ayamari Seigyo Gijyutsu, Ayamari Teisei Gijyutsu (see Jul. 7, 2014), published by Japan Patent Office
Non Patent Literature 2: 1.2 GHz/2.3 GHz-Band Portable OFDM Digital Transmission System for Television Program Contribution (ARIB STD-B57) issued by Association of Radio Industries and Businesses

SUMMARY OF INVENTION

Technical Problem

The conventional technique as described above has an issue of missing of bit information upon generation of a soft estimation value when turbo equalization signal processing is employed in a transmission system, where no termination processing is performed on a transmitting side, including an interleaver that performs random rearrangement having processing units over frames in order to enhance error correction. An object of the present invention is to generate a soft estimation value where missing of bit information is avoided and to implement turbo equalization processing in a wireless transmission apparatus and a wireless transmission system where termination processing is not performed in an error correction coding part and interleave processing over frames is performed.

Solution to Problem

A wireless transmission system of an embodiment of the present invention includes a transmission apparatus and a reception apparatus. The transmission apparatus includes: an error correction coding unit; a first interleave unit that performs rearrangement over frames; a second interleave unit that performs rearrangement within a frame; and a unit that performs digital modulation on data having been rearranged by the first interleave unit and the second interleave unit. The reception apparatus includes: a unit that detects a reception signal; a demapper unit that calculates a received bit logarithm of likelihood ratio; a second deinterleave unit that performs, on the received bit logarithm of likelihood ratio, rearrangement of an order of the data having been rearranged by the second interleave unit into an original order once again; a unit to store, in a frame buffer, the received bit logarithm of likelihood ratio having been rearranged by the second deinterleave unit into the original order; a frequency interleaver data extraction part that extracts data of a predetermined period; a decoding part; and a hard decision part.

In a wireless transmission system of an embodiment of the present invention, the demapper unit removes an interference component based on the first interleave unit that performs rearrangement over frames on an external log-likelihood ratio output from the decoding part, the second interleave unit that performs rearrangement within a frame, a unit that inputs an interleave output as prior information to the demapper, and the prior information.

A wireless transmission system of an embodiment of the present invention further includes a maximum a posteriori possibility decoding unit.

In a wireless transmission system of an embodiment of the present invention, the hard decision part performs hard decision processing on an information bit logarithm of likelihood ratio input thereto.

A reception apparatus of an embodiment of the present invention includes: a unit that detects a reception signal; a demapper unit that calculates a received bit logarithm of likelihood ratio; a second deinterleave unit that performs, on the received bit logarithm of likelihood ratio, rearrangement of an order of data having been rearranged by a second interleave unit into an original order once again; a unit to store, in a frame buffer, the received bit logarithm of likelihood ratio having been rearranged by the second deinterleave unit into the original order; a frequency interleaver data extraction part that extracts data of a predetermined period; a decoding part; and a hard decision part.

Advantageous Effects of Invention

According to the present invention, deterioration of decoding performance can be mitigated when BCJR decoding is used for turbo equalization processing even in a digital transmission system and an apparatus that do not perform termination processing in a transmission control part and perform interleave processing over frames.

DESCRIPTION OF EMBODIMENTS

Embodiments of the present invention will be described below with reference to the drawings. As a first example of the present invention, a case where turbo signal processing using BCJR decoding is applied to a reception control part of a transmission system including an interleaver that performs rearrangement over frames and a random interleaver that performs rearrangement within a frame will be described. For example in an FPU conforming to ARIB STD-B57, a bit interleaver that performs rearrangement in the unit of bits over OFDM symbols and a frequency interleaver that performs rearrangement on transmission signals of the respective transmission antennae in the unit of sub carriers in different patterns are combined, thereby implementing random rearrangement. An example of a spatial multiplexing MIMO transmission system of an FPU will be described below like in the conventional configuration for simplicity of description.

Figure 1:
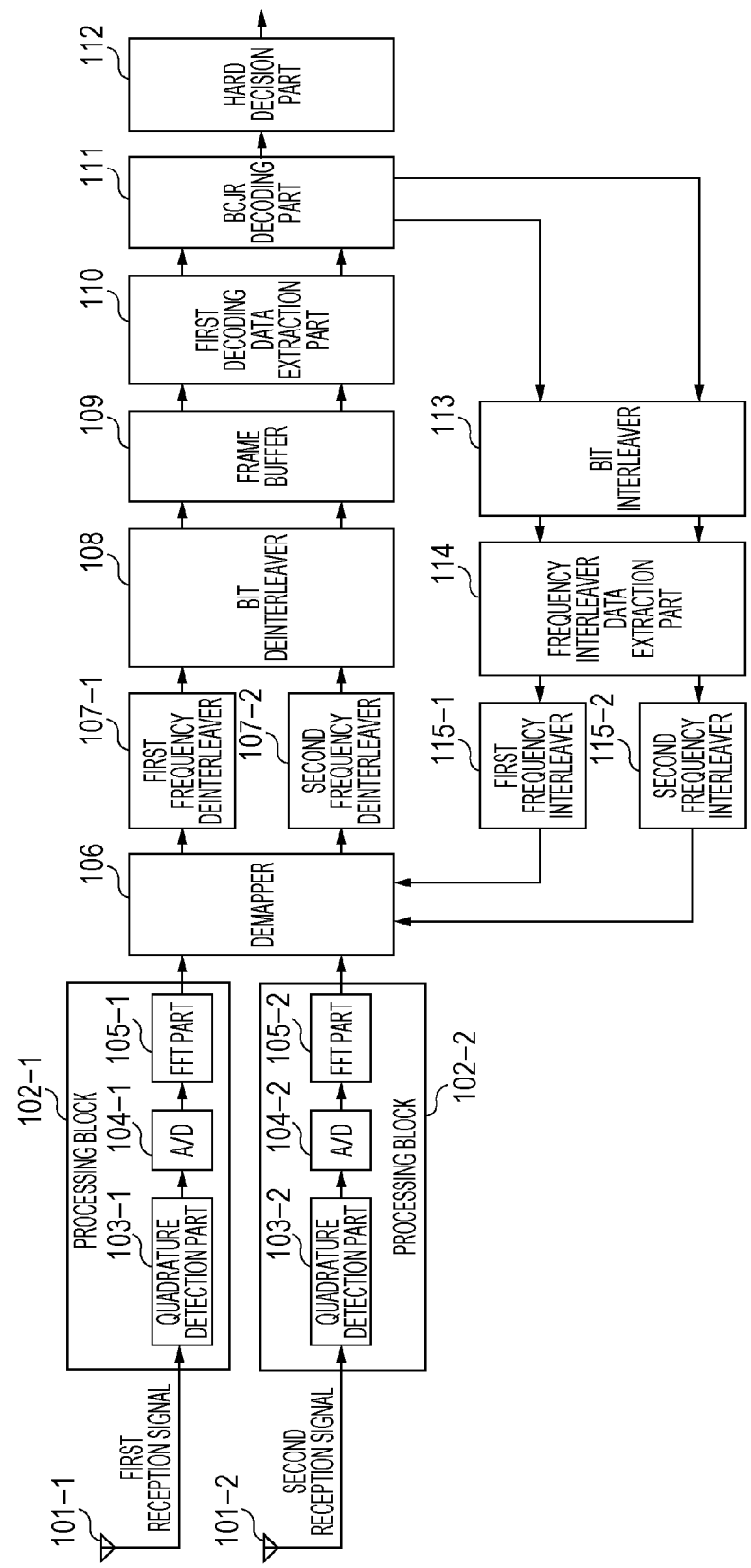
FIG. 1 is a block diagram explaining an exemplary configuration of a reception apparatus of an example of an embodiment of the present invention.
Figure 2:
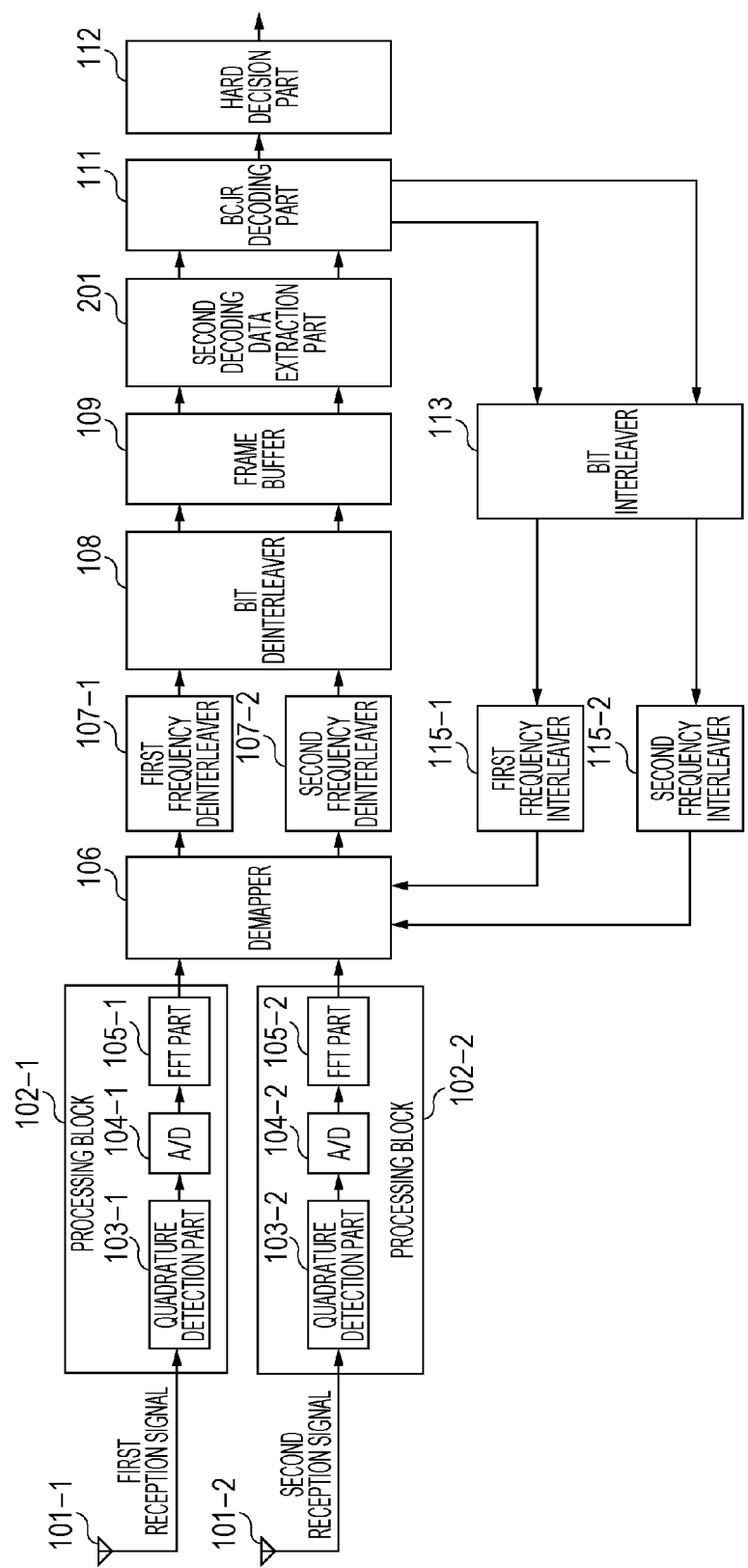
FIG. 2 is a block diagram explaining a configuration of a reception apparatus of the related art.
Figure 3:
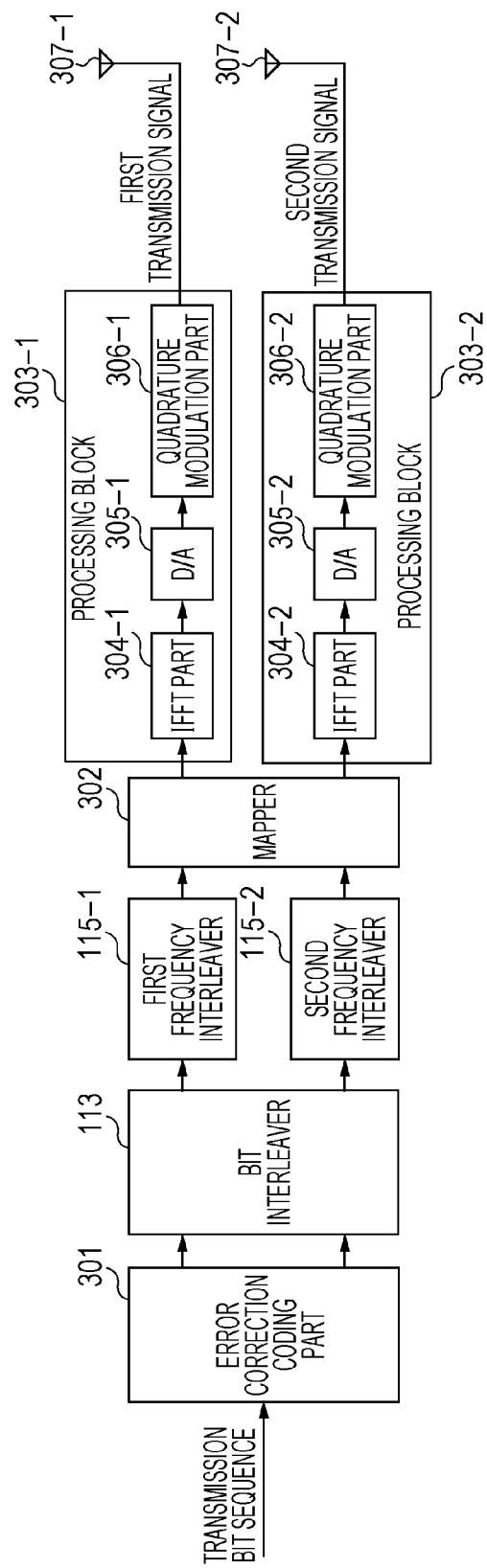
FIG. 3 is a block diagram explaining an exemplary configuration of a transmission apparatus according to ARIB standard ARIB STD-B57.
Figure 4:
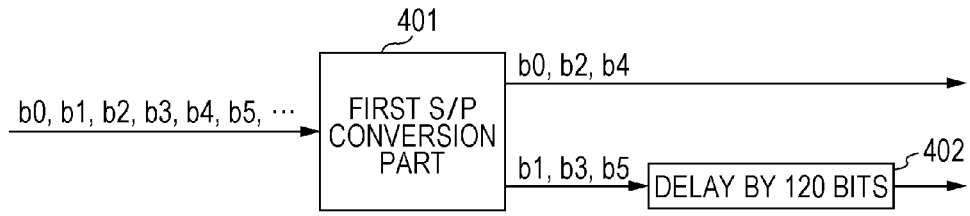
FIG. 4 is a diagram illustrating a bit interleave structure when a subcarrier modulation system according to ARIB standard ARIB STD-B57 is QPSK.
Figure 5:
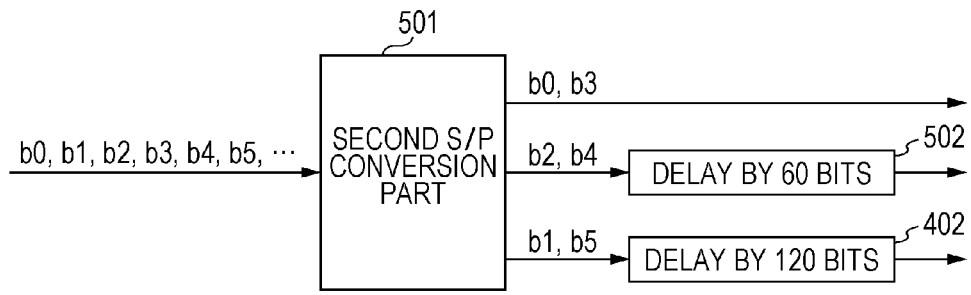
FIG. 5 is a diagram illustrating a bit interleave structure when a subcarrier modulation system according to ARIB standard ARIB STD-B57 is 8PSK.
Figure 6:
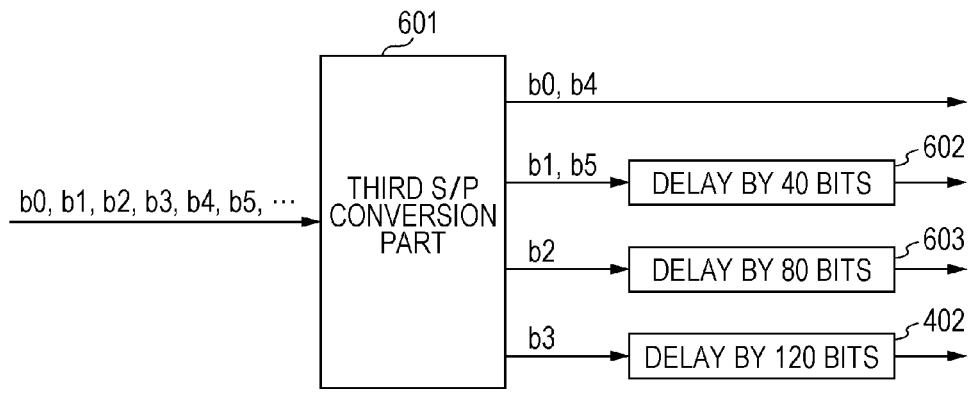
FIG. 6 is a diagram illustrating a bit interleave structure when a subcarrier modulation system by ARIB standard ARIB STD-B57 is 16QAM.
Figure 7:
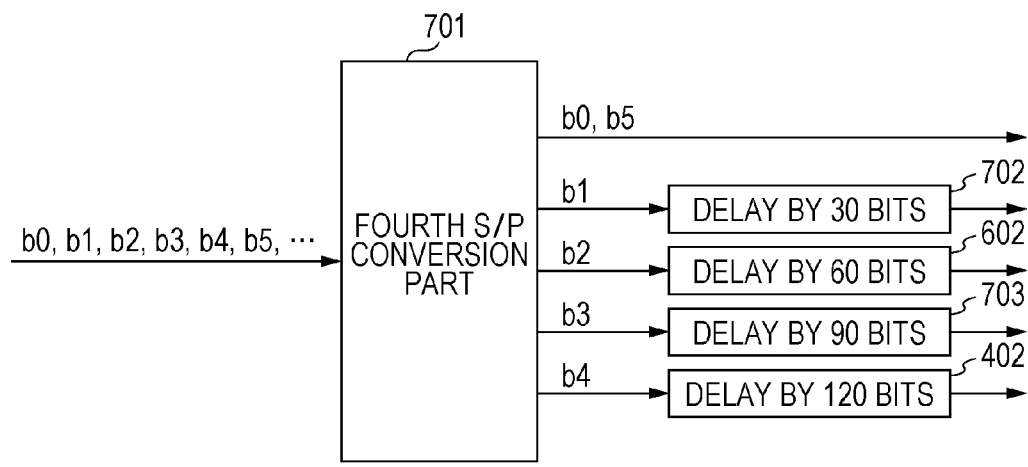
FIG. 7 is a diagram illustrating a bit interleave structure when a subcarrier modulation system according to ARIB standard ARIB STD-B57 is 32QAM.
Figure 8:
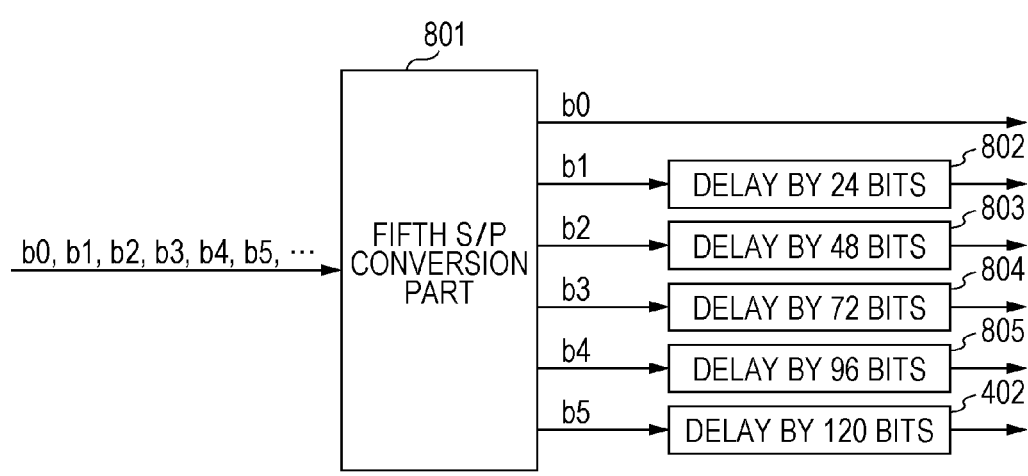
FIG. 8 is a diagram illustrating a bit interleave structure when a subcarrier modulation system according to ARIB STD-B57 is 64QAM.
Figure 9:
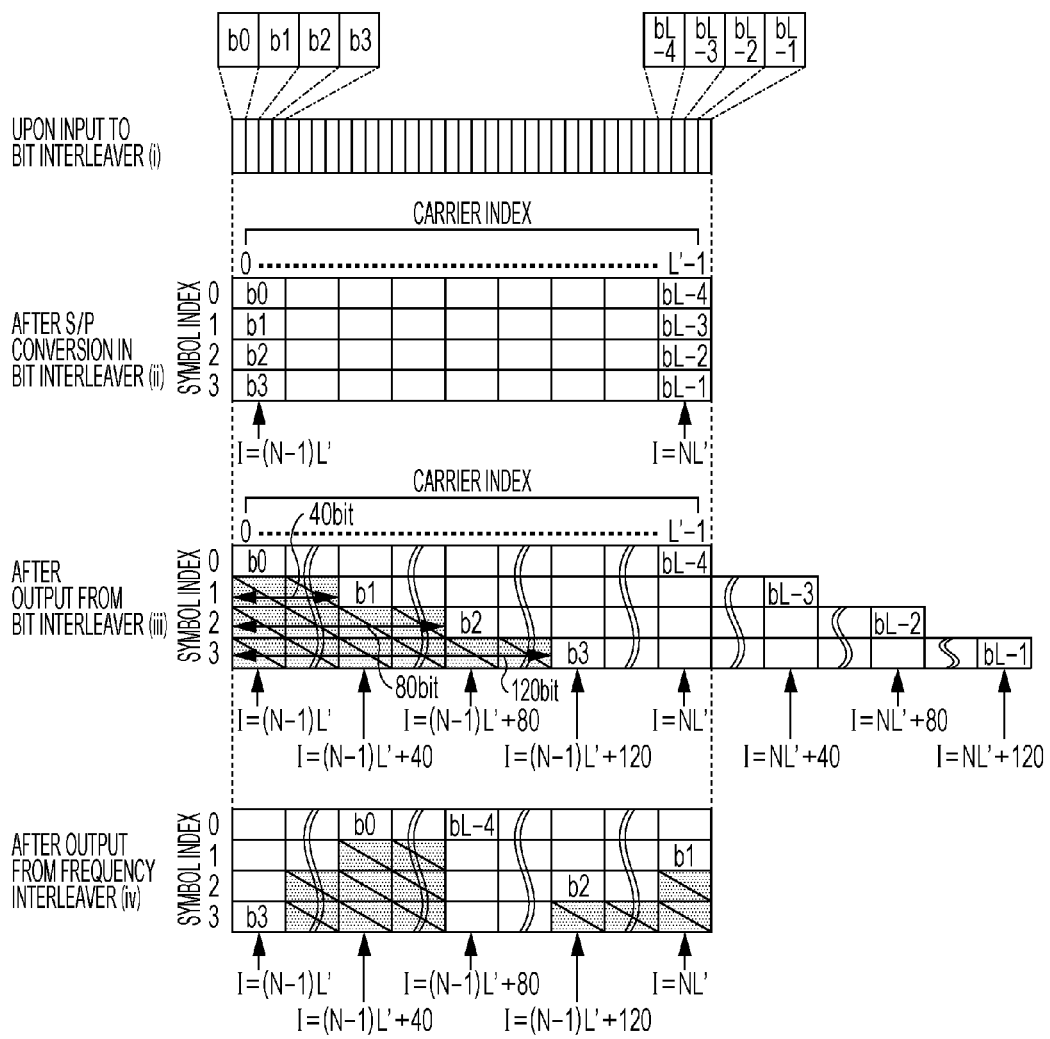
FIG. 9 is a diagram for explaining a bit sequence from before input to a bit interleaver to after output from a frequency interleaver according to ARIB STD-B57.

A flow of processing on the side of a reception apparatus of an embodiment of the present invention will be described with reference to FIG. 1. FIG. 1 is a block diagram explaining an exemplary configuration of a reception apparatus of an example of an embodiment of the present invention. In FIG. 1, a symbol 101-1 denotes a first reception antenna, 101-2 denotes a second reception antenna, 102-1 denotes a processing block corresponding to a first reception signal (103-1 denotes a quadrature detection part, 104-1 denotes an analog to digital converter (A/D), and 105-1 denotes a fast Fourier transform part (FFT part)), 102-2 denotes a processing block corresponding to a second reception signal (103-2 denotes a quadrature detection part, 104-2 denotes an A/D, and 105-2 denotes an FFT part), 106 denotes a demapper, 107-1 denotes a first frequency deinterleaver corresponding to the frequency interleaver 115-1, likewise, 107-2 denotes a second frequency deinterleaver corresponding to the frequency interleaver 115-2, 108 denotes a bit interleaver, 109 denotes a frame buffer, 110 denotes a first decoding data extraction part, 111 denotes a BCJR decoding part, 112 denotes a hard decision part, and 114 denotes a frequency interleaver data extraction part.

The reception signals received by the reception antennas 101-1 and 101-2 are converted from analog to digital sample sequences by the A/Ds 104-1 and 104-2 and a FFT time window of an effective symbol length is provided at such a timing that interference among symbols are avoided. The time axis data within the FFT time window are subjected to fast Fourier transform processing in the FFT parts 105-1 and 105-2 and then converted into frequency axis signals.

The demapper 106 generates a soft estimation value from an external LLR output from the decoder and having been subjected to interleave processing as soft canceller processing. An interference replica corresponding to each of the reception signals from the reception antenna 101-1 and the reception antenna 101-2 is generated from the obtained soft estimation value. The interference replica is subtracted from each of the reception signals. Note that this subtraction is not performed before repetition processing since there is no prior information on the interference replica. A signal subtracted of the interference component is input to the MMSE filter. Transmission signals from the respective transmission antennae are spatially filtered. A received bit LLR of a symbol is calculated from the separated and detected signal.

As for bit sequences related to the received bit LLR, a received bit LLR corresponding to a signal transmitted from the first transmission antenna 307-1 is input to the frequency deinterleaver 107-1 and a received bit LLR corresponding to a signal transmitted from the second transmission antenna 307-2 is input to the frequency deinterleaver 107-2. The frequency deinterleaver 107-1 once again rearranges an order of subcarriers having been rearranged in the frequency interleaver 115-1 into an original order. The frequency deinterleaver 107-2 once again rearranges an order of subcarriers having been rearranged in the frequency interleaver 115-2 into an original order. A unit of interleave processing is defined by L' similarly to that of the frequency interleaver. The bit sequence after frequency deinterleaving is output to the bit deinterleaver 108.

The bit sequence input to the bit deinterleaver 108 is removed of delay having been inserted in the bit interleaver 113 according to the type of subcarrier modulation system, then subjected to P/S conversion processing, and then output to the frame buffer 109. The frame buffer 109 stores, by a bit sequence length of L, the bit sequence related to the received bit LLR having been subjected to the series of deinterleave processing.

Figure 11:
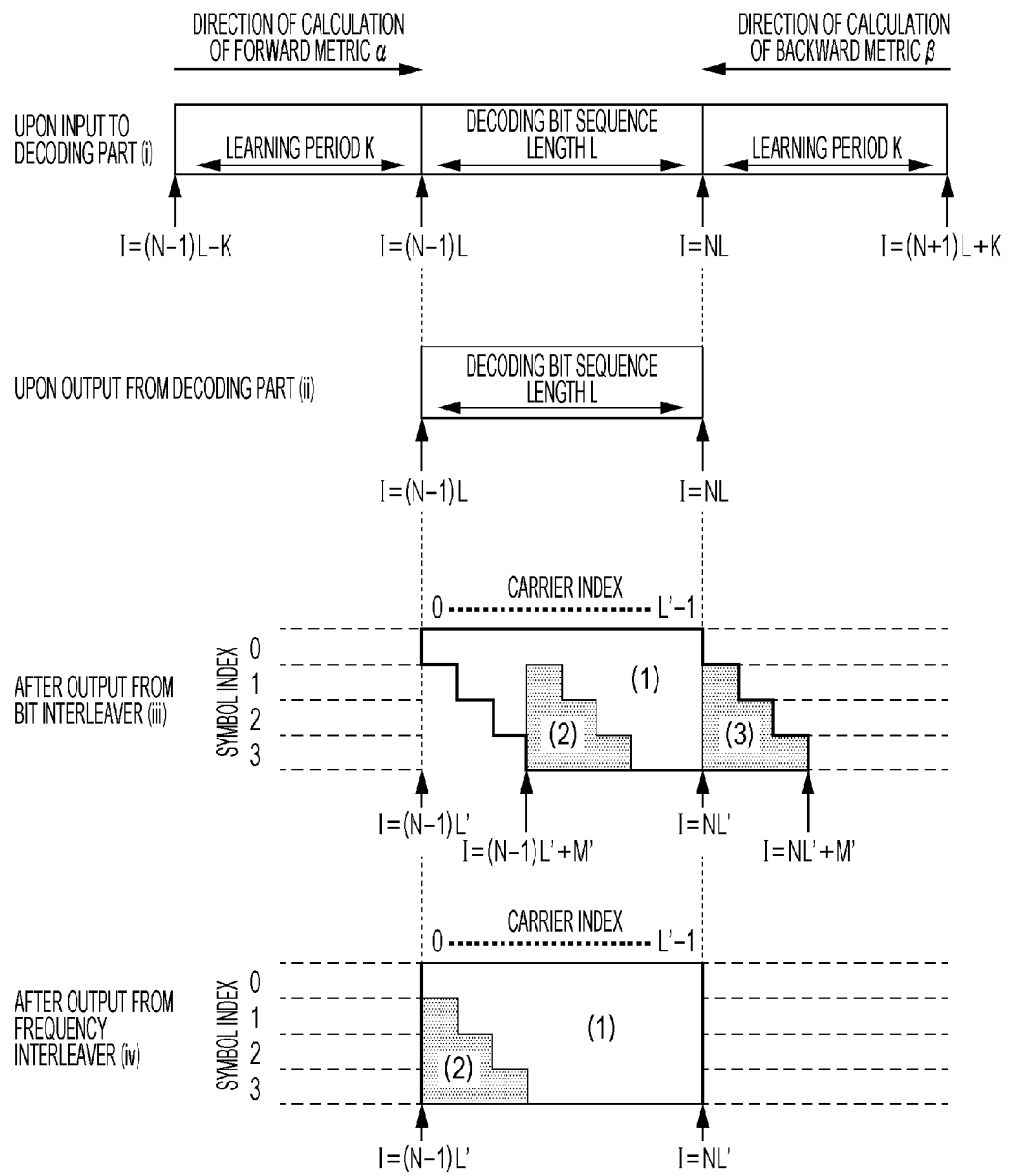
FIG. 11 is a diagram for explaining a bit sequence from input to a decoding part to before input to a frequency interleaver in a configuration of an example of an embodiment of the present invention.

Next, processing of the bit sequence from input to the decoding part to input to the frequency interleaver in a turbo loop of an example of the present invention is illustrated in FIG. 11. FIG. 11 is a diagram for explaining a bit sequence from input to a decoding part to before input to a frequency interleaver in a configuration of an example of an embodiment of the present invention. When an origin and a destination of the Nth OFDM symbol to be subjected to decoding processing are defined as 1=(N−1)L and 1=NL, respectively, a bit sequence from 1=(N−1)L−(K+M) to 1=NL+K is extracted from the frame buffer 109 using the first decoding data extraction part 110 and input to the BCJR decoding part 111 ((i) in FIG. 11). Here, M=M'Q holds where K represents a trellis learning period, M' represents the maximum value of the bit sequence length delayed by interleaving over frames, and Q represents the number of bits allocated to one modulation symbol.

A transition state probability γ and a forward metric α are calculated based on a reception bit LLR of the trellis learning period K from 1=(N−1)L−(K+M) to 1=(N−1)L−M input to the BCJR decoding part 111 and thereby an internal state at 1=(N−1)L−M is specified. In the similar manner, the transition state probability γ and a backward metric β are calculated based on a reception bit LLR of the trellis learning period K from 1=NL+K to 1=NL and thereby an internal state at 1=NL is specified.

Using the internal state at 1=(N−1)L−M and an internal state at 1=NL obtained from the above processing, the transition state probability γ, the forward metric α, and the backward metric β for a bit sequence from 1=(N−1)L−M to 1=NL are calculated. In the BCJR decoding part 111, 1=(N−1)L−M to 1=NL are decoded using Formulas 4 to 6 from the obtained γ, α, and β and a decoded bit LLR and a coded bit LLR are then calculated and output ((ii) in FIG. 11). The obtained coded bit LLR having the length of L+M from 1=(N−1)L−M to 1=NL is subtracted of a prior LLR input to the BCJR decoding part 111 having the length L+M from 1=(N−1)L−M to 1=NL to derive an external LLR output from the BCJR decoding part 111.

The external LLR output from the BCJR decoding part 111 is input to the bit interleaver 113. In the bit interleaver 113, S/P conversion is performed by a unit of bits like on the transmission side and then convolutional interleave processing is performed by a delay element according to the type of subcarrier modulation system, followed by output therefrom ((iii) in FIG. 11). Here M'=120 carrier symbols are delayed at the maximum by the 120 bit delay element 402.

Figure 10:
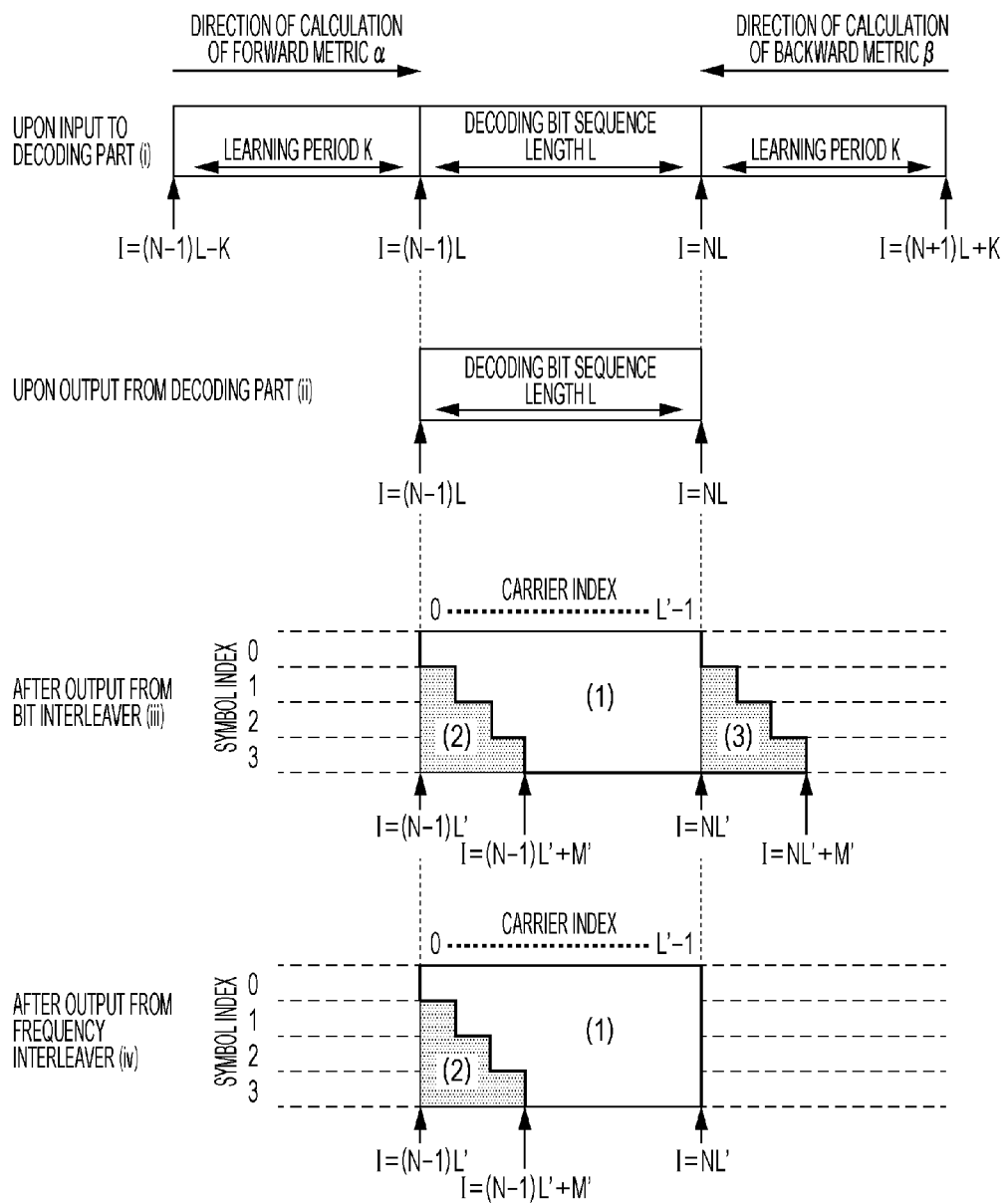
FIG. 10 is a diagram for explaining a bit sequence from input to a decoding part to before input to a frequency interleaver in a turbo loop in a conventional configuration.

The external LLR having been subjected to bit interleave processing has no missing of bit information as described in (iv) in FIG. 10 since data from 1=(N−1)L' to 1=NL' is extracted in the frequency interleaver data extraction part 114 ((iv) in FIG. 11). The external LLR corresponding to a transmission signal from the first transmission antenna 307-1 is input to the frequency interleaver 115-1 and the external LLR corresponding to a transmission signal from the second transmission antenna 307-2 is input to the frequency interleaver 115-2. In the respective frequency interleavers, subcarriers of OFDM symbols formed by the input bit sequences are rearranged by a predetermined order. Here, rearrangement is performed in different patterns between the frequency interleaver 115-1 and the frequency interleaver 115-2 for output. A unit of processing of frequency interleaving is L', which is corresponds to the number of data subcarriers of the OFDM symbols. Rearrangement is performed within a range of this length L'.

A bit sequence of the external LLR having been subjected to the series of interleave processing is input to the demapper 106 and a soft estimation value is calculated from the external LLR and mapping points that may be used in the subcarrier modulation system. From this soft estimation value an interference replica of the first reception signal corresponding to the first reception antenna 101-1 and an interference replica of the second reception signal corresponding to the second reception antenna 101-2 are generated and the interference replica is subtracted from each of the reception signals.

The above processing is one round of turbo equalization signal processing and repeating this processing for a plurality of times allows for enhancing decoding performance. The number of repetitions is a predetermined number of times T or repetition is made until decoding performance satisfies predetermined performance. With an information bit LLR obtained by a maximum a posteriori possibility decoding unit, the hard decision part 112 provides a final decoding result.

[Mathematical Formula 3]

In the hard decision part 112, hard decision processing is performed on the input information bit LLR ($L_u^D$) and an encoding result u is output. The hard decision processing is for example performed by Formula 7.

$$u = \begin{cases} 0 & | \ L_u^D \geq 0 \\ 1 & | \ L_u^D < 0 \end{cases} \quad \text{(Formula 7)}$$

According to the example as described above, extending the unit of sliding window decoding allows for generating a soft estimation value where missing of bit information is avoided for turbo equalization processing and mitigating deterioration of decoding performance even in a digital transmission system and an apparatus that perform interleave processing over frames.

In the example described above, descriptions are given using the FPU of a spatial multiplexing MIMO transmission system; however, the present invention can employed also in turbo equalization signal processing related to intersymbol interference (ISI) of a single carrier.

The wireless transmission system of an embodiment of the present invention allows deterioration of decoding performance to be mitigated when BCJR decoding is used for turbo equalization processing even in a digital transmission system and an apparatus that do not perform termination processing in a transmission control part and perform interleave processing over frames.

The FFT part 105-1 and 105-2, the demapper 106, the first frequency deinterleaver 107-1, the second frequency deinterleaver 107-2, the bit interleaver 108, the frame buffer 109, the first decoding data extraction part 110, the BCJR decoding part 111, the hard decision part 112, the bit interleaver 113, denotes a frequency interleaver data extraction part 114, the first frequency interleaver 105-1, and the second frequency interleaver 105-2 could be implemented with any combination of CPU, DSP or FPGA as a processor, a RAM as a memory and ROM as a storage of programs or configuration data for the processor.

INDUSTRIAL APPLICABILITY

The present invention has been described in detail in the above; however, the present invention is not limited to the wireless transmission systems described herein but may be widely employed in wireless transmission systems other than those described above.

REFERENCE SIGNS LIST 101-1, 2 reception antenna
103-1, 2 quadrature detection part
104-1, 2 A/D
105-1, 2 FFT part
106 demapper
107-1, 2 frequency deinterleaver
108 bit deinterleaver
109 frame buffer
110 first decoding data extraction part
111 BCJR decoding part
112 hard decision part
113 bit interleaver
114 frequency interleaver data extraction part
115-1, 2 frequency interleaver
201 second decoding data extraction part
301 error correction coding part
302 mapper
304-1, 2 IFFT part
305-1, 2 D/A
306-1, 2 quadrature modulation part
307-1, 2 transmission antenna
401 first S/P conversion part
402 120 bit delay element
501 second S/P conversion part
502 60 bit delay element
601 third S/P conversion part
602 40 bit delay element
603 80 bit delay element
701 fourth S/P conversion part
702 30 bit delay element
703 90 bit delay element
801 fifth S/P conversion part
802 24 bit delay element
803 48 bit delay element
804 72 bit delay element
805 96 bit delay element

The invention claimed is:

1. A Multi Input Multi Output (MIMO) reception apparatus that receives a signal having been subjected to error correction coding on a transmission side, performed with a first interleaving of performing rearrangement over frames that are predetermined transmission units, thereafter performed with a second interleaving of performing rearrangement within a frame, and transmitted while mapped to a symbol and performs turbo equalization, the MIMO reception apparatus comprising:
   a detector that detects each reception signal received by a plurality of antennae;
   a demapper that calculates each received bit log-likelihood ratio (LLR) by performing separation detection and interference removal of a substream from a plurality of signals detected by the detector and prior information;
   a frequency deinterleaver that performs, on the received bit LLR of each of the plurality of antennae, rearrangement of an order of data having been rearranged by the second interleaving into an original order;
   a bit deinterleaver that performs, on output from the frequency deinterleaver, rearrangement of an order of data having been rearranged by the first interleaving into an original order;
   a frame buffer that stores the received bit LLR having been rearranged by the bit deinterleaver into the original order with respect to a frame to be decoded and a part of a frame preceding or following the frame;
   a decoder that reads the received bit LLR stored in the frame buffer, and performs on the received bit LLR, maximum a posteriori possibility decoding based on a Bahl, Cocke, Jelinek and Raviv (BCJR) algorithm, and outputs an external LLR; and
   an interleaver that performs the first interleaving and the second interleaving on the external LLR and provides the external LLR to the demapper as the prior information,
   wherein, a decoding bit sequence length of the frame is denoted as a real number L, a trellis learning period is denoted as a real number K, a maximum value of delay over the frames due to the first interleaving is denoted as a real number M' symbols, a number of bits allotted to a symbol is denoted as a real number Q, and a real number M is represented as M=M'Q,
   wherein the decoder decodes a real number Nth frame represented by bit sequence numbers 1 from 1=(N−1)L to 1=NL by:
   calculating a transition state probability γ and a forward metric α from 1=(N−1)L−(K+M) to 1=(N−1)L by reading the received bit LLR from 1=(N−1)L−(K+M) to 1=NL+K from the frame buffer and regarding the received bit LLR as a prior LLR,
   calculating a transition state probability γ and a backward metric β from 1=NL+K to 1=NL,
   calculating a decoded bit LLR and a coded bit LLR by decoding from 1=(N−1)L−M to 1=NL based on the BCJR algorithm using specified states where 1=(N−1)L−M and 1=NL, and
   outputting the external LLR obtained by subtracting the received bit LLR input thereto from the coded bit LLR in a length from 1=(N−1)L−M to 1=NL.

2. The MIMO reception apparatus of claim 1,
   wherein the first interleaving is bit interleaving,
   wherein the second interleaving is frequency interleaving, wherein the mapped to symbol is transmitted from the transmission side by Orthogonal Frequency Division Multiplexing (OFDM) wherein a number of data subcarriers is L'−L/Q, wherein the demapper employs an SC/MMSE system, and wherein the decoder calculates the decoded bit LLR and the coded bit LLR using the Max-Log-MAP.

3. The MIMO reception apparatus of claim 2, wherein the bit interleaving includes interleaving by S/P conversion of input signals into parallel signals of Q bits and providing a delay different for each of the Q lines of signals, and the frequency interleaving includes interleaving in units of the Q bits output from the first interleaving.

4. A television broadcast program material transmission system that includes the MIMO reception apparatus of claim 2.

5. A Multi Input Multi Output (MIMO) reception method, comprising:

receiving a signal having been subjected to error correction coding on a transmission side, performed with first interleaving of performing rearrangement over frames that are predetermined transmission units, thereafter performed with second interleaving of performing rearrangement within a frame, and transmitted while mapped to a symbol and performing turbo equalization;

detecting, by a detection process, each reception signal received by a plurality of antennae; calculating, by a demapping process, each received bit log-likelihood ratio (LLR) by performing separation detection and interference removal of a substream from a plurality of signals detected in the detection process and prior information;

performing, by a frequency deinterleaving process, on the received bit LLR of each of the plurality of antennae, rearrangement of an order of data having been rearranged by the second interleaving into an original order;

performing, by a bit deinterleaving process, on output from the frequency deinterleaving process, rearrangement of an order of data having been rearranged by the first interleaving into an original order; storing, by a storing process, in a frame buffer, the received bit LLR having been rearranged in the bit deinterleaving process into the original order with respect to a frame to be decoded and a part of a frame preceding or following the frame;

reading, by a decoding process, the received bit LLR stored in the frame buffer, and performing on the received bit LLR, maximum a posteriori possibility decoding based on a Bahl, Cocke, Jelinek and Raviv (BCJR) algorithm, and outputting an external LLR; and performing the first interleaving and the second interleaving on the external LLR and providing the external LLR to the demapping process as the prior information, wherein, a decoding bit sequence length of the frame is denoted as a real number L, a trellis learning period is denoted as a real number K, a maximum value of delay over the frames due to the first interleaving is denoted as a real number M' symbols, a number of bits allotted to a symbol is denoted as a real number Q, and a real number M is represented as M=M'Q, wherein to decode a real number Nth frame represented by bit sequence numbers l from l (N−1)L to l=NL, the decoding process includes:

calculating a transition state probability γ and a forward metric α from l=(N−1)L−(K+M) to l=(N−1)L by reading the received bit LLR from l=(N−1)L−(K+M) to l=(NL+K) from the frame buffer and regarding the received bit LLR as a prior LLR;

calculating a transition state probability γ and a backward metric β from l=NL+K to l=NL;

calculating a decoded bit LLR and a coded bit LLR by decoding from l=(N−1)L−M to l=NL based on the BCJR algorithm using specified states where l=(N−1)L−M and l=NL; and outputting the external LLR obtained by subtracting the received bit LLR input thereto from the coded bit LLR in a length from l=(N−1)L−M to l=NL.

* * * * *